United States Patent [19]

Shannon

[11] 3,721,839

[45] March 20, 1973

[54] SOLID STATE IMAGING DEVICE WITH FET SENSOR

[75] Inventor: John Martin Shannon, Bosham, Chichester, Sussex, England

[73] Assignee: U.S. Philips Corporation, New York, N.Y.

[22] Filed: March 24, 1971

[21] Appl. No.: 127,596

[52] U.S. Cl.................307/304, 250/211 J, 307/311, 317/235 A, 317/235 G, 317/235 N, 317/235 NA

[51] Int. Cl...........................H01l 15/00, H01l 11/14

[58] Field of Search.......250/211 J, 220 M; 307/304, 307/311; 317/235 N, 235 NA

[56] References Cited

UNITED STATES PATENTS

| | | | |
|---|---|---|---|
| 3,453,507 | 7/1969 | Archer | 307/311 X |
| 3,051,840 | 8/1962 | Davis | 307/311 X |
| 3,390,273 | 6/1968 | Weckler | 317/235 N |
| 3,373,295 | 3/1968 | Lambert | 307/304 X |
| 3,448,344 | 6/1969 | Schuster et al. | 317/235 N |
| 3,617,823 | 11/1971 | Hofstein | 317/235 N |

*Primary Examiner*—John W. Huckert
*Assistant Examiner*—William D. Larkins
*Attorney*—Frank R. Trifari

[57] ABSTRACT

A solid state imaging device is described. Junction FETs are employed as the sensors in a charge storage mode. In the non-illuminated condition, each FET has its channel blocked by a depletion region formed by pulsing the gate. Under illumination, the depletion region withdraws, opening up the channel. Each imaging FET element is sensed by pulsing its source or drain, following which its gate is pulsed to reblock the channel. Also, an integrated circuit version of the device, the photo-JFETs having annular photo-gate regions and having a common substrate gate, the color response of the device being controlled by bias on the substrate gate.

18 Claims, 10 Drawing Figures

*INVENTOR.*
J. M. SHANNON

*BY* Frank R. Trifari
AGENT

*INVENTOR.*
J. M. SHANNON

*BY* Frank R. Trifari
AGENT

INVENTOR.
J. M. SHANNON

BY Frank R. Trifari
AGENT

*INVENTOR.*
J. M. SHANNON

*BY*
AGENT

INVENTOR.
J. M. SHANNON
BY
Frank R. Trifari
AGENT

SOLID STATE IMAGING DEVICE WITH FET SENSOR

This invention relates to a solid state imaging device.

Solid state imaging devices are well known in the art, and detailed descriptions of a number of different constructions will be found in IEEE Transactions on Electron Devices, Volume ED–15, No. 4, pages 256–261 (April 1968) and IEEE Spectrum of March 1969, pages 52–65. Many of the devices described in these publications when reduced to practice suffer from the handicap of relatively small signal output levels. Since all of these multi-element imaging systems inherently include a multitude of internal capacitances coupled by way of common substrate or connections to the image element being interrogated, accompanying the output signal is a high level of noise representing the capacitance coupled signals from the non-interrogated elements. The relatively low signal-to-noise level of such known devices has been unsatisfactory.

Vidicon tubes as imaging devices are also well known. The vidicon tube offers the advantage of operation in the charge storage mode. This means that a charge is stored on each imaging element for the full frame time between the interrogating intervals, and the output signal represents the stored charge remaining after the frame time interval. The application of this principle to solid state imaging devices has provided similar advantages without, however, substantially improving the signal-to-noise ratio, because the spurious signal from the capacitance-coupled non-interrogated elements, which arises during switching from element to element, coinciding with the signal, maintains the noise level high.

The main object of the invention is an improved solid state imaging device for operation in the charge storage mode providing higher signal-to-noise ratios.

A further object of the invention is a solid state imaging device which can be readily manufactured by well known semiconductor planar techniques.

Still another object of the invention is a solid state imaging device whose color response can be varied at will.

Still a further object of the invention is to separate the signal from the switching noise.

These and other objects of the inventions as will appear hereinafter are achieved in accordance with the invention by employing a junction field effect transistor as the photosensitive element of the solid state imaging device. The junction field effect transistor (JFET) is a known photosensitive semiconductor device. However, to employ such a device for the purposes of this invention requires its reconstruction in order to utilize the charge storage mode and to avoid or at least mitigate the problems that arise from the interconnection of a large number of such devices in the form of a linear array or in the form of a two-dimensional array or mosaic. In a preferred embodiment of the invention, the photosensitive devices are integrated into a single crystal wafer of semiconductor photosensitive material which comprises a substrate of one type conductivity on which is provided a relatively thin epitaxial layer of the opposite type conductivity and of higher resistivity. Into the epitaxial layer is provided for each imaging element a relatively small region of the opposite type conductivity but of much lower resistivity, to a shallow depth substantially less than that of the epitaxial layer, and this region, which will serve as the drain electrode of a junction field effect transistor, is surrounded by but spaced from a generally annular shallow region of the one type conductivity and of relatively low resistivity to serve as the gate electrode. Each imaging element of the linear array or mosaic is thus characterized by a drain electrode surrounded by an annular gate, all in the same epitaxial layer. All of the image elements in a line have a common source, which in this case represents a connection to the epitaxial layer which is located outside of the annular gate.

In operation, when a suitable voltage pulse is applied to the gate and thus across the p–n junction between the gate and the epitaxial layer, a depletion field will extend from the gate junction so as to extend completely across the epitaxial layer until it reaches the one type substrate or a depletion region extending from the one type substrate, in order to form an annular depletion region completely blocking the channel between the common source and each of the drains within each of the surrounding depletion regions. When the gate voltage is removed, the depletion regions remain in existence during a frame time except for their slow discharge due to dark current leakage. To interrogate any image element, a voltage pulse is applied to the drain of that element. This may be done at any time or as many times as required, the interrogation being non-destructive. With no incident radiation, the channel of that element exhibits a high impedence and the output signal across an impedence in series with that element will be small. Radiation falling on that image element between interrogations will cause the stored charge to leak off at a rate proportional to the radiation intensity and the resistance of the channel reduces accordingly. If sufficient radiation is incident, the gate diode is completely discharged and most of the interrogating pulse will appear across the series impedance.

This mode of operation in the charge storage mode differs from the prior art constructions in that the output signal not only represents the accumulated stored charge which has been transferred to the output circuit during interrogation, but also includes the much higher signal obtained as a result of the amplification provided by the field effect transistor element. Ratios exceeding a thousand in the output voltages with and without radiation incident on the image element can be obtained in this way, with a voltage level of the order of volts compared with millivolts from prior art constructions.

As will be evident from the foregoing brief description, in order to achieve the desired charge storage mode of operation, each image element of the array must have separately accessible gate and drain or source connections, so that each image element can be interrogated when desired by pulsing its drain or source, after which its gate can be pulsed to restore the charge on the gate diode, which will occur at the end of each frame time interval.

A further feature of the invention enables the color response of the imaging device to be varied at will. This is obtained by establishing a permanent bias between the substrate and the common source to establish a depletion region extending from the substrate into the epitaxial layer. The depth of that depletion region will determine the location or depth of the channel from the surface on which the radiation is incident. As is well known, different wavelengths of radiation penetrate to different depths in the semiconductor; thus red light penetrates more deeply than blue light. By changing the substrate bias and the extension of its depletion layer, it is possible to control the depth of the sensitive part of the epitaxial layer and thus make the device more sensitive to the blue or the red light as desired.

In accordance with another feature of the invention, each row or column of photosensitive FETs can be interrogated simultaneously, and then simultaneously recharged, by coupling all the sources or drain electrodes to a delay line, and pulsing the other of the source or drain electrodes, and recharging is accomplished by coupling an auxiliary device, such as an MOS transistor, to each of the FET gates.

There will now be described in detail several embodiments illustrating various constructions in accordance with the invention, taken in conjunction with the attached drawings, of which:

Figure 1:
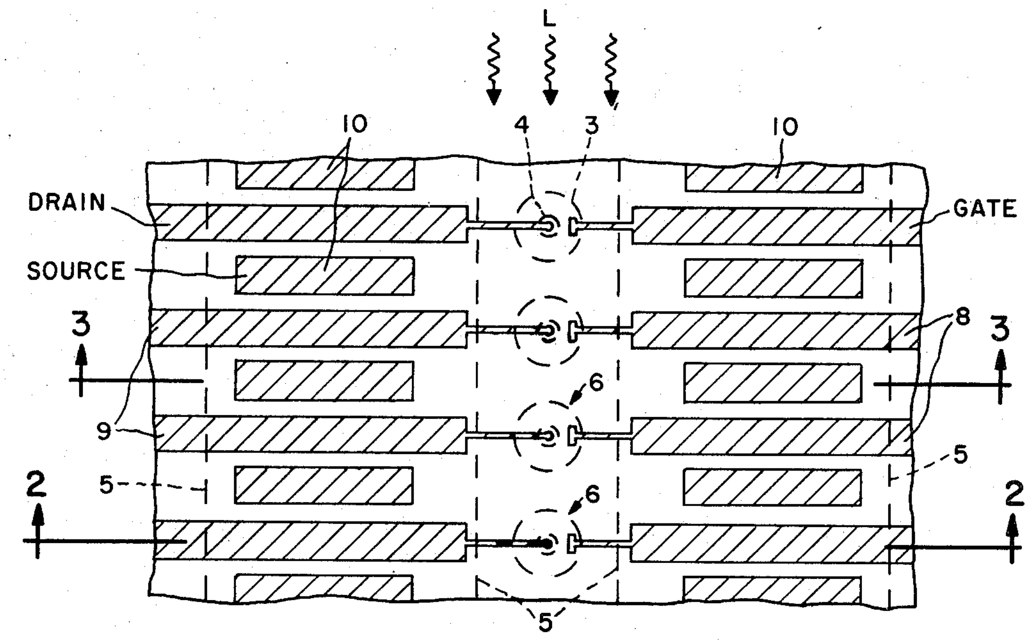
FIG. 1 is a top view of part of one form of imaging device containing a linear array of elements in accordance with the invention.
Figure 2:
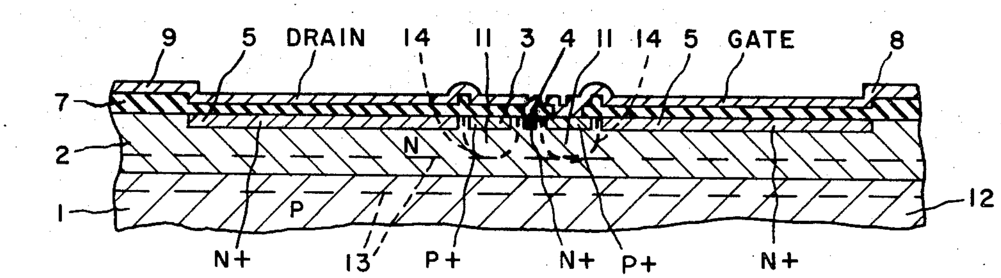
FIG. 2 is a cross-sectional view of the embodiment of FIG. 1 taken along the line 2—2.
Figure 3:
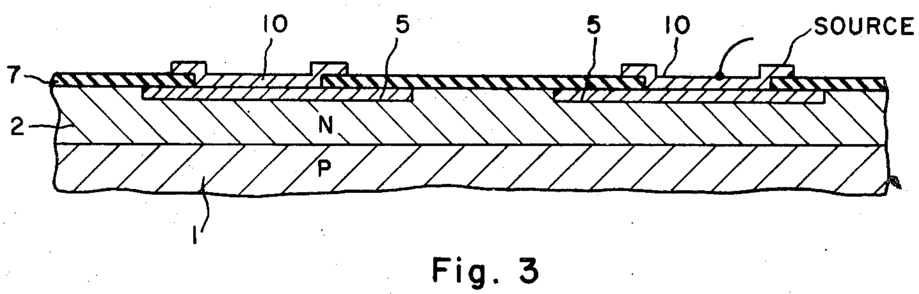
FIG. 3 is a cross-sectional view of the embodiment of FIG. 1 taken along the line 3—3.

FIGS. 1, 2, and 3 illustrate one form of the invention for use as a linear array, which can be used to image a line of radiation. As is well known, such devices are useful as optical readers and similar detecting devices for converting an incident light pattern into an electric signal. In this embodiment and the other embodiments to be discussed, the junction field effect transistors will be N-channel devices. It is understood, however, that this is merely exemplary, and the desired results of the invention could be achieved with P-channel transistors by simply reversing the P and N type regions and reversing the potentials, a practice that is well known in the art. Also, it will be understood that the drawings are not always to scale and the various spacings and geometries shown throughout are not necessarily correct. Those skilled in the art will readily recognize the desired spacings and geometries required in order to achieve the mode of operation described. Particularly, the depth of the layers in FIGS. 2, 3 and 7 has been greatly enlarged to clarify the showings.

The first embodiment comprises a common P-type wafer or substrate 1 of single crystal semiconductor material, for example of silicon, of relatively low resistivity, for example, 0.1 ohm-cm. The substrate has grown on it a higher resistance opposite or N-type epitaxial layer 2, for example of 10 ohm-cm resistivity, with a thickness by way of example of 10 micrometers. Using standard planar diffusion techniques or ion implantation, which are both well known in the art, an annular, shown circular P+ surface region 3 is formed in the epitaxial layer 2, and of a shallow depth substantially less than the thickness of the epitaxial layer, to serve as a gate region. For example, the depth may be 0.5 micrometers, and the acceptor concentration average approximately $10^{19}$ boron atoms per cubic cm. Next, again by normal diffusion or ion implantation techniques are provided a circular drain region 4 which lies within the annular gate 3, and two large area source contact regions 5 extending along the top surface of the wafer. It will be observed that there are a number of these FET circular structures 6 produced in the common wafer. Each of these junctions FETs 6 constitutes a single image element and the plurality form the linear array, of whatever number is desired. Both the drain and source contact regions 4 and 5 are of N+ type material and may have the same donor concentration and depth. Phosphorus is suitable for this purpose. When the described structure is produced by a diffusion technique, a masking silicon oxide layer 7 exists on the wafer surface and in which the usual holes are provided by normal photoresist techniques to determine the size of the source, drain, and gate regions and contacts to be made thereto. As is shown, each gate 3 is contacted by a separate metallization, produced in the conventional manner, and deposited on the oxide 7. The separate gate contacts are designated by reference numeral 8. Similarly, each drain region 4 is separately contacted by a metallization on the oxide 7 and designated 9. In order to reduce the source resistance, the N+ source 5 has metallizations provided on it between the drain and gate metallizations, which have been shown at 10. Any one or more of the source contacts 10 may have a connecting lead bonded thereto as a common source connection for the entire array, of which, however, each FET imaging element 6 has a separate gate and a separate drain connection. A connection may also be made to the substrate 1 as shown in FIG. 2 at 12.

As will be observed from FIG. 2, a generally annular FET geometry is illustrated with a current flow from the source region 5 to the drain 4 when possible via an annular channel 11 extending under the annular gate 3 and between it and the substrate 1. It is possible to block off that channel 11 by establishing a depletion region extending from the gate region 3 to the substrate, which can be accomplished by applying a negative voltage to the P-gate 3. It will also be appreciated that if a negative voltage were also applied to the P substrate 1, then a depletion region would also extend from the epitaxial-substrate interface into the epitaxial layer. It is thus possible to block the channel of each FET either by a voltage 1 to the gate 3 alone, or by separate voltages to the P-gate 3 and P-substrate 1. In FIG. 2 is illustrated the latter possibility. The dashed lines 13 represent the extent of the depletion layer by a voltage in the blocking direction applied across the NP junction between epitaxial layer 2 and substrate 1, and the dashed lines 14 represents the depletion layer extending from the P-gate 3 upon the application of a negative voltage thereto to bias it in the reverse direction. Since the N epitaxial layer 2 has a substantially higher resistivity than that of the P-gate 3 and of the substrate 1, the depletion layers will extend mostly in the epitaxial layer 2. As will be noted, the overlapping depletion regions block off the channel 11. When a voltage is applied between the source 5 and the drain 4, then substantially no current will flow in an output circuit connected to those electrodes. However, if radiation indicated in FIG. 1 by the arrows labelled L is incident on the surface of the structure and is of sufficient energy to penetrate into the N-type epitaxial layer within the depletion layer region or a diffusion length therefrom, then electron hole pairs are created, and the electrons will be swept to the gate diode junction causing the voltage on said gate to be partially discharged. The extent of discharge will depend upon the illumination.

In operation, each of the gate diodes are biased to block its associated imaging FET. This occurs just after interrogation. The biasing source is then removed. Except for the usual dark current leakage, the channel remains blocked for the entire frame time, i.e., the time between interrogations, unless incident radiation creates free carriers which when swept across the back-biased junction will cause a discharge of that gate junction or diode which in turn will cause the depletion region to withdraw. The amount of withdrawal is of course related to the amount of radiation generated free carriers. Thus, in the time between interrogations, the FET image element will integrate the free carriers generated by the incident radiation for that entire period, which is the charge storage mode of operation desired. To read the stored charge condition, the source and drain of each FET are turned on by pulsing the source or drain at any time during the frame time, and the amount of current flowing in the output circuit will depend upon the size of the channel. As will also be noted, not only will the output current represent the stored charge or rather the change in the stored charge over the entire frame time, but also multiplied by the gain of the FET as an amplifier. Moreover, since the interrogation does not alter the charge condition, nondestructive readout is accomplished, and the charge condition can be interrogated several times without changing its charged state absent further new radiation.

Figure 4:
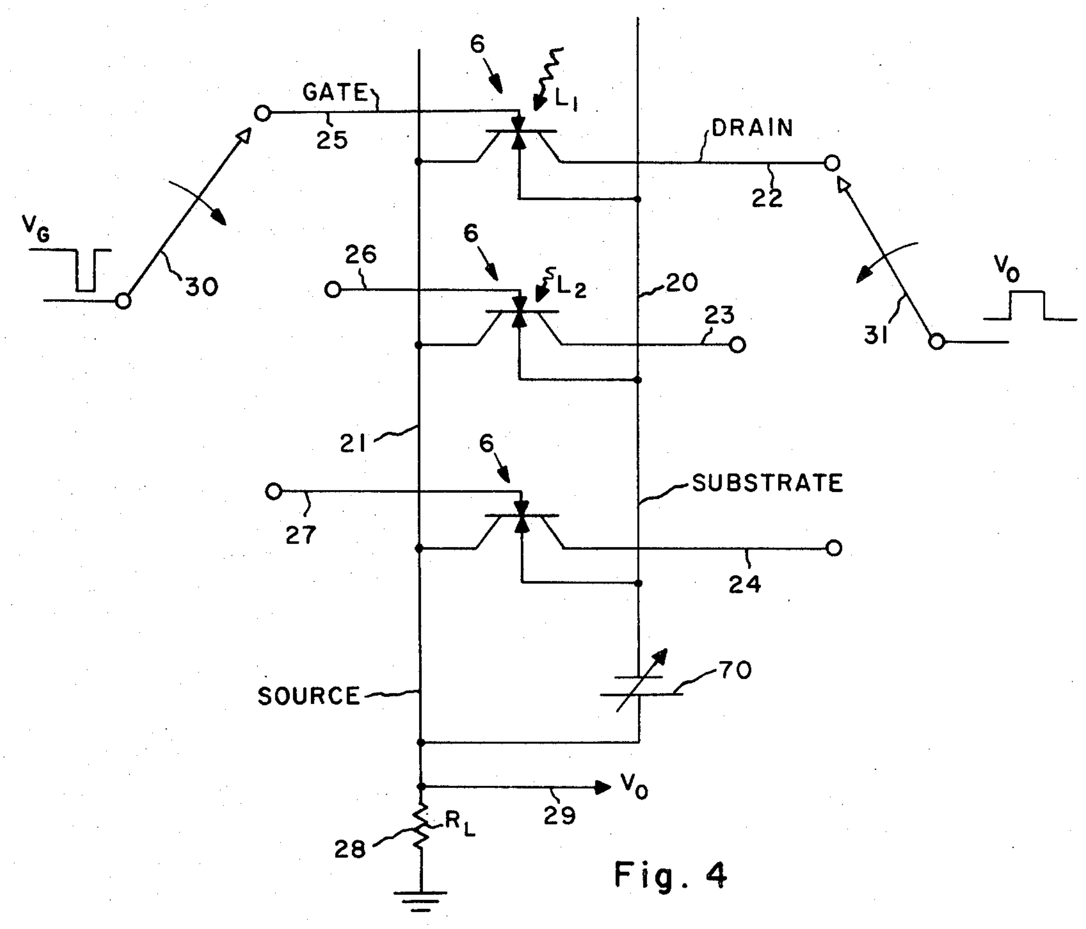
FIG. 4 is a partial circuit diagram illustrating operation of the embodiment of FIG. 1.

An illustrative operating circuit for the embodiment of FIG. 1 appears in FIG. 4. Each of the image elements 6 is represented by a conventional junction FET symbol. As will be noted, the substrate 1 designated by the connection 20 is common to all the imaging elements. Similarly, the source 5 is common and is designated by the connection 21. The drain connections to the individual elements are represented by 22–24 and the gate connections to the individual elements are represented by 25–27. The output signal is taken from a load resistor 28 via a connection 29. The output signal is designated $V_o$.

The charging circuitry is shown schematically by a rotary switch 30 by means of which a negative-going pulse $V_G$ can be applied in sequence to each of the gates. The interrogation is by means of a second schematically shown rotary switch 31 which applies a positive-going pulse $V_o$ to each of the drain connections in sequence. The rotary switches are only symbolic, and as is well known can be replaced by registers or similar circuitry, as is described in the aforementioned publications. The radiation incident on each of the elements is shown symbolically by arrows labelled $L_1$ for the first element, $L_2$ for the second element, and no light for the third element.

Figure 5:
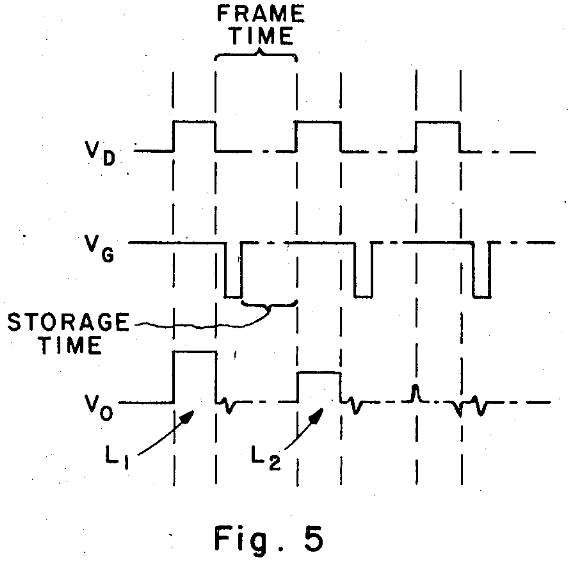
FIG. 5 shows various voltage waveforms associated with the circuit of FIG. 4.

The mode of operation will be clear from the three waveforms depicted in FIG. 5. The top waveform represents the interrogation pulses $V_D$ applied in sequence to the drain of each of the image elements; the middle waveform is the recharging pulses applied in sequence to each of the gates of the image elements just after the interrogation pulse; and the bottom waveform represents the output signal derived for the different illuminations indicated. Thus, the large level of illumination $L_1$ of the first element would cause large unblocking of the channel and thus a large signal output across the load resistor 28. The smaller illumination $L_2$ of the second image element will in turn cause a smaller unblocking of the channel and a smaller output signal. With no light on the third image element, and assuming insignificant leakage, the output signal will only show the switching spikes illustrated. After each interrogation, the gate is recharged to a level to reblock the channel, and the gate diode remains throughout the frame time in this charged condition unless discharged by absorbed radiation. Accordingly, a true stored charge mode of operation is obtained.

Figure 6:
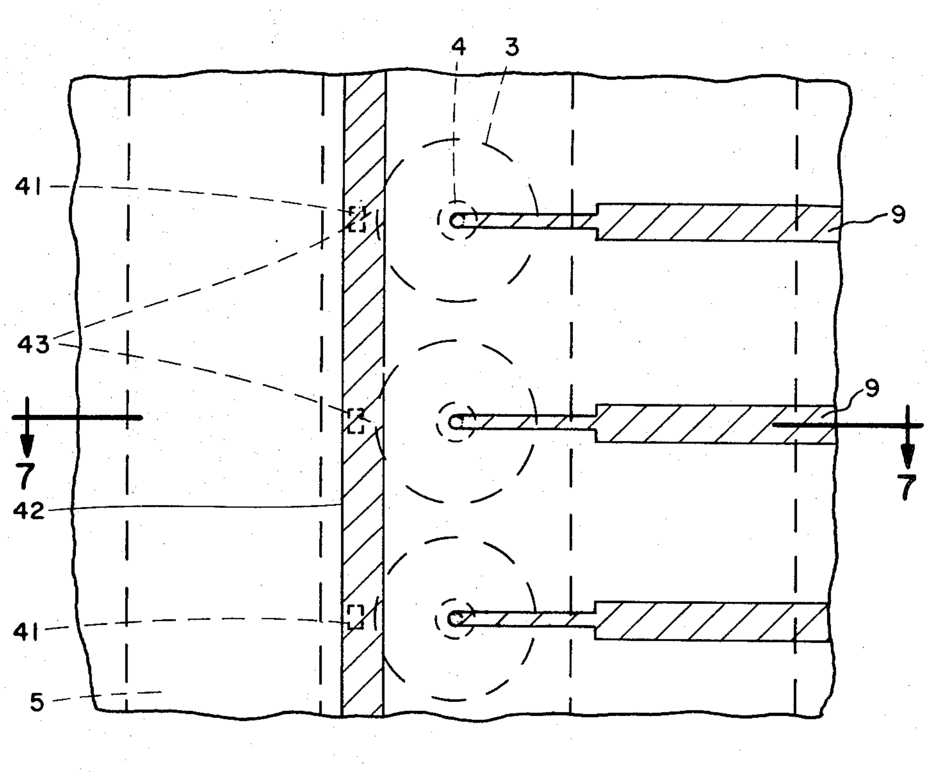
FIG. 6 is a top view of another form of imaging device in accordance with the invention containing a linear array of elements for simultaneous interrogation.
Figure 7:
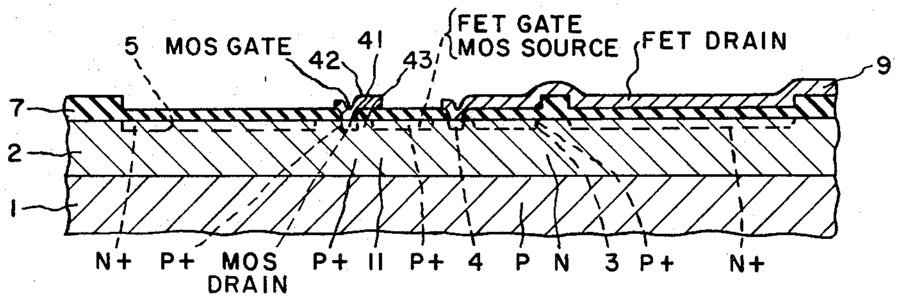
FIG. 7 is a cross-sectional view of the embodiment of FIG. 6 taken along the line 7—7.

FIGS. 6 and 7 show a different embodiment in accordance with the invention providing for simultaneous interrogation and subsequent simultaneous recharging of the individual junction FET image elements instead of the sequential operation depicted in connection with FIG. 1–3. The geometry of the junction FETs is similar, comprising drains 4, a common source 5, and separate annular gates 3 defining an annular channel 11. The sole difference is that, instead of direct connection to the gate 3 in order to charge up the gate diode, the charging is accomplished via an auxillary MOS transistor 40 whose source is the gate region 3 of the junction FET. The MOS transistor drain is a small P+ region 41 adjacent to and outside of the annular FET gate 3. The MOS channel lies in the surface epitaxial region 43 between its source 3 and drain 41. The MOS gate is an elongate strip metallization 42 on the oxide 7 and overlying all of the channels 43 between each separate drain 42 and the adjacent source 3. The MOS gate 42 is also directly connected through holes in the oxide 7 to each of the MOS drains 41.

Figure 8:
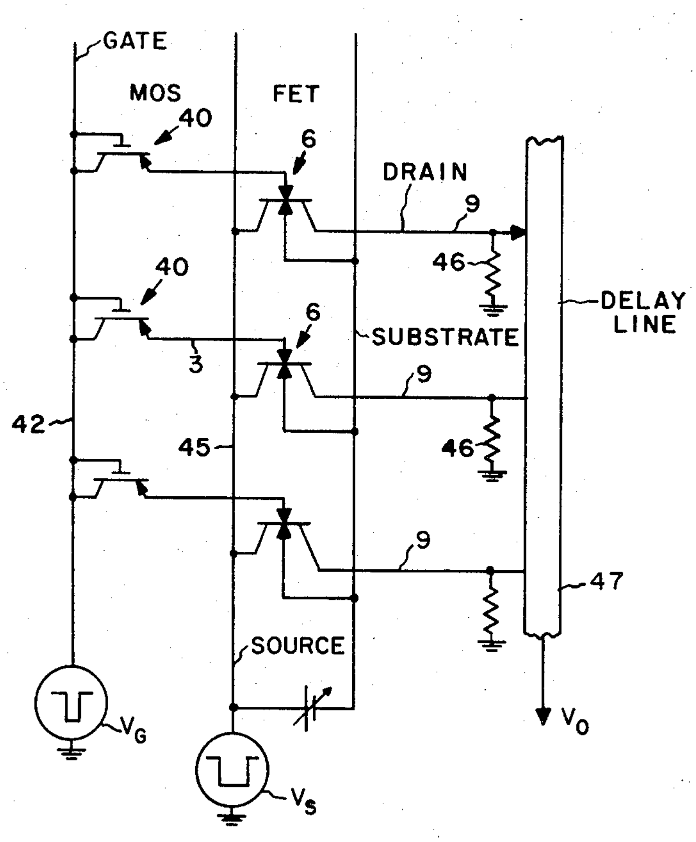
FIG. 8 is a partial circuit diagram for the embodiment of FIG. 6.

FIG. 8 illustrates schematically a circuit for operating the embodiment of FIGS. 6 and 7. The junction FET imaging elements are designated 6 as before. In this embodiment, during interrogation, all of the common sources are pulsed with a negative-going pulse $V_s$ via a connection 45 to the region 5. The output signal is taken separately from each FET drain via its connection 9 and load resistors 46 and introduced into a delay line 47, from whose output the video signal Vo is derived. The FET gates are simultaneously charged via the MOS transistors 40 whose source 3 is the same as the FET gate 3. The MOS gates and drains 41 are all interconnected via connection 42 to a gate voltage source generating negative-going pulses $V_G$.

In operation, at the end of the frame interval, all the imaging FET sources are simultaneously pulsed causing them each to conduct in proportion to the extent that their channels have become unblocked due to incident radiation. The signals thus obtained are supplied to the delay line 47, from which, as is well known, each signal suffers a different delay causing the signals while simultaneously going into the delay line to reappear at the output in proper sequence to make up a normal video signal $V_o$; thus interrogation of all elements occurs simultaneously. Just after the interrogation pulse $V_s$, the recharge pulse $V_G$ is simultaneously applied to the MOS gate-drains. The polarity is such as to cause all the MOSs to turn on simultaneously causing conduction through each MOS and causing its source 3 to assume a negative potential. When the pulse terminates, the MOS transistor switches off and source 3, now gate 3 of each FET, remains charged reblocking all the FET channels.

Figure 9:
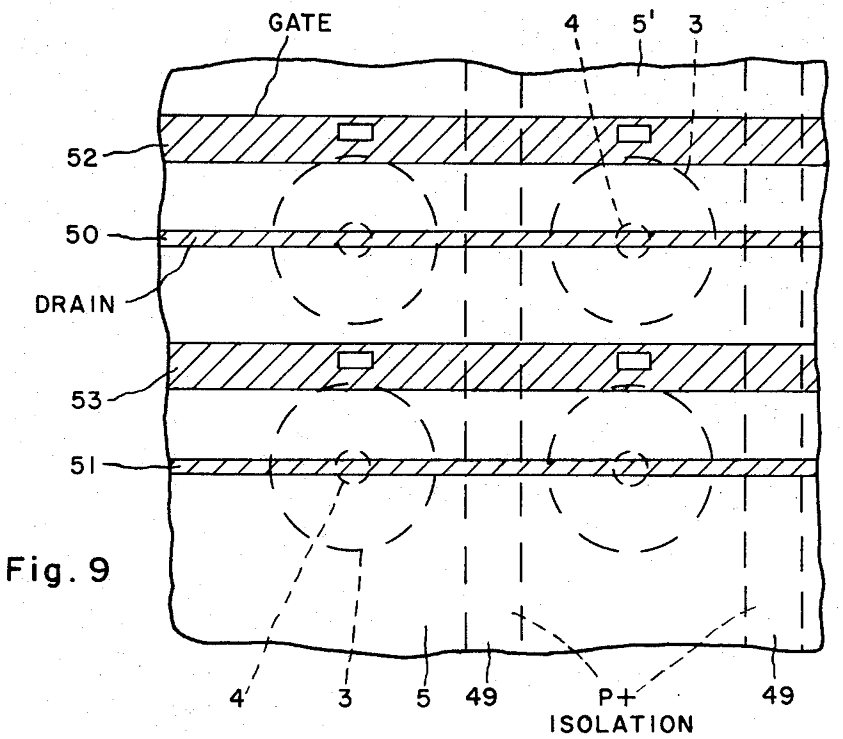
FIG. 9 is a partial top view of an imaging device in accordance with the invention containing a two-dimensional array of elements.
Figure 10:
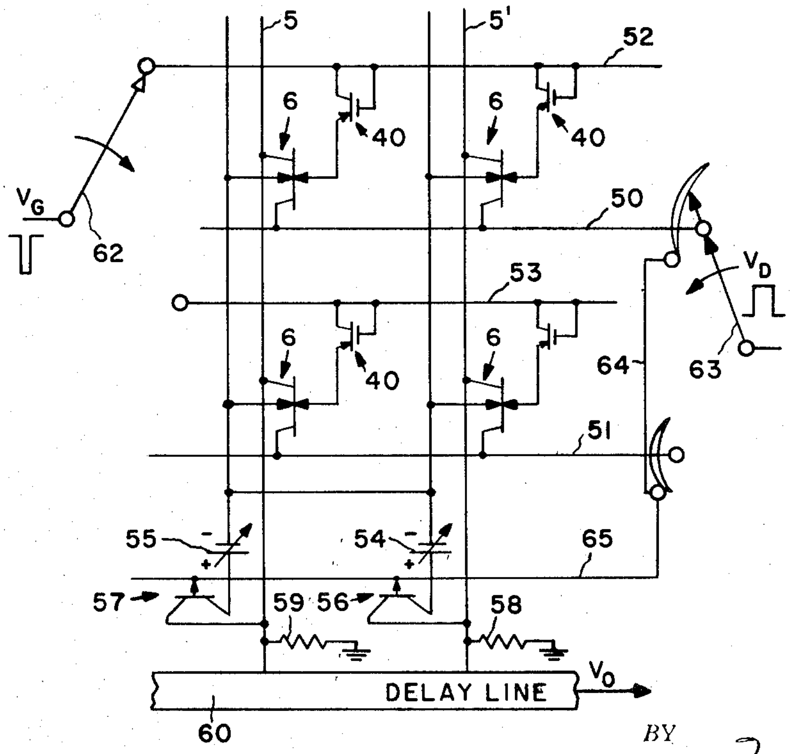
FIG. 10 is a partial circuit diagram for the embodiment of FIG. 9.

FIGS. 9 and 10 illustrate one way of extending the linear array of FIGS. 6–8 to provide a two-dimensional array or mosaic. Corresponding elements have the same reference numerals. As before, the junction FET imaging elements are designated 6 and comprise individual drains 4, gates 3 and all the FETs in a column have a common source 5,5'. The columns of FETs 6 are isolated by P + diffused regions 49 which extend as lines vertically through the mosaic between the surface and the P substrate 1, known as such in the semiconductor art as diffusion or junction isolation. Each row of FET drains are connected together by strip metallization, designated 50, 51. As in the FIGS. 6–8 embodiment, each FET gate is connected via an integrated MOS 40 to charging lines comprising the MOS gates. Each row of MOSs has a common gate connection designated 52, 53. All of the FET substrates (1 in FIG. 2) are connected together to a voltage supply 54, 55, the positive side of which for each column of FETs is connected to the source of a P-channel junction FET 56, 57, which may be provided on a different chip or integrated into the semiconductor with the other elements shown. The drain of this auxiliary FET 56,57 is connected via a load resistor 58,59 to a delay line 60 and to the sources 5,5[1] of each column of imaging FETs. For recharging, each row of imaging FETs is pulsed sequentially with a negative-going pulse $V_G$ via the symbollic rotary switch 62. The outputs are again taken from the sources and fed into the delay line 60 from whence they emerge as the usual video signal Vo. The auxiliary FETs 56,57 serve the function of isolating the interrogated imaging element sources 5 from the substrate 1 during interrogation. Thus, the auxiliary FETs 56,57 are normally on during the entire frame time, and then are cut-off by the application of the same positive-going pulse Vs to its gate via lines 64,65. To ensure that the source are properly isolated during interrogation, the fixed contacts of the switch 63 are arranged so that the time of application of the pulse Vs to the auxiliary FETs 56,57 completely overlaps the time of application to the FET drains. Alternatively, of course, separate pulse sources can be provided with the pulse applied to the auxiliary FETs 56,57 being longer than that applied to interrogate the imaging FETs 6.

To achieve the mosaic charge storage mode of operation described requires thus that the gate and drain row lines 50–53 are parallel to one another and both intersect the P+ column isolation strips 49 as illustrated in FIG. 9. This offers the further advantage that only one layer of metallization is required in the fabrication of the device.

To illustrate by way of example the pulse time sequence for charging and interrogation, as illustrated in FIG. 5, for a frame time interval of about 2 milliseconds, a typical interrogation pulse width would be about 2 microseconds, and a typical recharging pulse about 1 microsecond.

As earlier mentioned, after the recharging pulse is applied, the imaging FET gate should be effectively isolated to prevent the charge on the gate diode from leaking off except via recombination due to incident radiation. Many known ways of accomplishing this purpose exist, as will be clear from the aforementioned publications. For example, a diode can be used in series in each gate line. Alternatively, a capacitor can be connected in series in each gate line. In this latter case, however, the recharging pulse will have to have the opposite polarity so that the JFET gate will be forward biased thereby charging the series capacitor. The JFET gate then charges when the pulse is removed.

One of the features of the invention is that the recharging pulse for the imaging FETs occurs at a different time than the interrogation pulse. This means that switching transients occurring during recharging will not reduce the signal-to-noise ratio during interrogation. Moreover, the switching transients occurring during interrogation are maximum during the initial portion of the pulse. By extending the time of the interrogation pulse, the noise due to the switching transients can be separated from the signal thereby further improving the signal-to-noise ratio. This follows from the non-destructive readout feature of the invention. Still further, the size of the switching transient is related to the size of the drain-substrate capacitance, which is minimized in the inventive construction due to the small drain inset in the annular gate.

Another advantage is that the initial amplitude of the recharging pulse can be adjusted to control the degree of blocking of the imaging FET channels. This principle can be employed, for example, by overdriving the gate, when there is bias applied to the substrate to establish the depletion region 13 at the substrate-epitaxial interface, in order to establish a threshold level below which the JFET will not turn on. In this way it is possible to choose a threshold to offset leakage current through the junction during the storage time to ensure that the devices remain blocked in the absence of incident radiation.

Another advantageous way of operating the device is to unbias the substrate, or connect it to the source electrode. If a gate pulse is chosen to have an amplitude value causing the depletion region 14 to reach the substrate 1, then punch-through occurs limiting the amount of charge stored in the diode. All the imaging FETs even with different punch-through voltages can therefore be completely blocked by employing a gate pulse large enough to block the one with the highest punch-through voltage. Under these conditions, the output signal voltage, below saturation, is independent of both the magnitude of the recharging pulse and the punch-through voltage.

As previously mentioned, all of the embodiments described offer the feature that the depth of the sensitive channel part of the epitaxial layer 2 can be controlled by a voltage applied between the substrate 1 and the epitaxial layer 2 causing a depletion region 13 to extend up into the layer to meet the depletion region 14 extending downward from the gate 3, as depicted in FIG. 1. By varying the voltage applied between the substrate 1 and epitaxial layer 2, shown schematically by variable battery 70 in FIG. 4, the depth of the channel 11 can be varied. By varying its depth, the imaging device can be made more sensitive to red or blue portions of the spectrum, as these radiations penetrate to different depths. For example, by moving the depletion region 13 upward closer to the surface, the red sensitivity is reduced. Conversely, by reducing the extent of the depletion region 13, the red sensitivity is increased.

While silicon has been employed as the semiconductor in the described embodiments, it is of course possible to substitute other well known semiconductors in its place. Similarly, other active devices or switch circuits can be employed in place of the auxiliary MOSs 40 and auxiliary JFETs 56,57 depicted in the embodiment of FIGS. 9 and 10. It is further understood, as with the known silicon vidicon tube, that the radiation image can be replaced with an electron image, X-ray image, or in general any energy image capable of generating hole-electron pairs in the imaging element semiconductor.

Those skilled in the art will also recognize that variations in the devices described are possible within the principles outlines. Thus, while the invention has been described in its preferred embodiments, it is understood that no limitation on the scope of the invention is intended, and that changes therein may be made without departing from the true scope and spirit of the invention in its broad aspects.

What is claimed is:

1. A solid state imaging device comprising a semiconductive body having a substrate of one type conductivity of relatively low resistivity and an epitaxial layer of the opposite type conductivity of relatively high resistivity, plural junction FETs in said body, each of said FETs comprising in the epitaxial layer a surface drain region of opposite type conductivity and of relatively low resistivity and an annular surface gate region of one type conductivity and of relatively low resistivity and surrounding the associated drain region forming a channel region in the epitaxial layer of relatively high resistivity under the gate region and between the latter and the substrate, said FETs having in the epitaxial layer a source region of opposite type conductivity and or relatively low resistivity located outside the annular gate regions, means for intermittently applying a voltage to the gate region of each FET for charging the diode junction between each gate region and the adjacent channel region, means for maintaining the gate diode charged upon removal of the applied voltage and in the absence of irradiation of the body, and means for intermittently applying an interrogation voltage between the drain and source regions of each FET subsequent to the time of applying the voltage to the gate diode and including means for deriving a signal indicative of the charge condition of each gate diode, whereby irradiation of the body in the vicinity of the channel region causes discharge of the associated gate diode causing an increase in the source-drain current related to the total absorbed radiation occurring between the time of the charging and interrogation voltages.

2. An imaging device as set forth in claim 1 wherein plural FETs are arranged to form a linear array, and means are provided to separately connect to the gate of each FET, and means are provided to separately connect to the source or drain of each FET.

3. An imaging device as set forth in claim 1 wherein means are provided to establish a reverse potential across the P-N junction between the substrate and epitaxial layer.

4. An imaging device as set forth in claim 3 wherein the reverse potential establishing means is variable.

5. An imaging device as set forth in claim 1 and including means for pulsing the FET gate regions in sequence.

6. An imaging device as set forth in claim 5 and including means for pulsing the FET drain or source regions in sequence, said FET gate pulse immediately following after the source or drain pulse.

7. An imaging device as set forth in claim 1 wherein means are provided for simultaneously pulsing the gate regions of each line of FETs to simultaneously charge up all the gate diodes.

8. An imaging device as set forth in claim 7 wherein the simultaneous pulsing means includes an MOS device whose source region constitutes the FET gate region, and whose drain region is laterally spaced therefrom, and whose gate extends over the body surface between its source and drain.

9. An imaging device as set forth in claim 8 wherein each FET has its associated MOS device, and the gates of the MOS devices are all interconnected.

10. An imaging device as set forth in claim 1 wherein the junction FETs are arranged in rows and columns, means are provided in the body to isolate the columns of FETs, all the row FETs have interconnected gates, and all the row FETs have interconnected sources or drains.

11. An imaging device as set forth in claim 10 wherein the isolation means comprises an elongated isolation region in the body extending from the surface to the substrate and of the latter's type of conductivity.

12. A solid state imaging device for operation in the charge storage mode comprising plural junction FETs having source, drain, and gate regions defining a channel region adjacent the gate and between the source and drain regions, said gate regions forming plural gate diodes with the adjacent channel regions, means for charging the gate diodes by an applied voltage to block the associated channels and maintain the gate diodes charged for a frame time interval in the absence of incident energy, means for interrogating each FET at the end of the frame time interval to determine the charge state of its gate diode, said device being arranged to receive incident energy capable of penetrating to within a diffusion length of the plural channels and thereby discharge each gate diode in relation to the intensity of the total energy incident thereon during the entire frame time interval, and means for recharging the gate diodes immediately subsequent to the interrogation of the associated FET.

13. An imaging device as set forth in claim 12 wherein each FET comprises a small center drain region surrounded by and spaced from an annular gate region to isolate each FET drain from a source region common to plural FETs.

14. An imaging device as set forth in claim 1, wherein the voltage applied to the said diode junction is sufficient to completely block the channel.

15. An imaging device as set forth in claim 1, wherein the interrogation pulse has a substantially uniform magnitude over a time interval of the order of microseconds.

16. A solid state imaging device for operation in the charge storage mode comprising a junction FET having source, drain, and gate regions defining a channel region adjacent the gate and between the source and drain regions, said gate region forming a gate diode with the adjacent channel region, means for charging the gate diode by applying thereto a reverse voltage and for maintaining the gate diode charge for a certain storage time interval after removal of the gate voltage and in the absence of the incident energy, means for interrogating the FET at the end of the certain time interval to determine the charge state of its gate diode, said device being arranged to receive incident energy capable of penetrating to within a diffusion length of the channel and produce free carriers to thereby discharge the gate diode in relation to the intensity of the total energy incident thereon during the entire certain time interval, and means for recharging the gate diode subsequent to the interrogation of the FET to begin a new storage time interval, said interrogation means including means for applying a voltage between source and drain of the FET for determining the conductance of the FET but without causing a substantial alteration in said conductance.

17. An imaging device as set forth in claim 16 wherein the charging means applies a voltage capable of blocking the channel at the beginning of each new storage time interval.

18. An imaging device as set forth in claim 17 and including a plurality of said junction FETs arranged in a line.

* * * * *